(12) United States Patent
Won et al.

(10) Patent No.: US 8,575,635 B2
(45) Date of Patent: Nov. 5, 2013

(54) LIGHT EMITTING DEVICE, LIGHT EMITTING DEVICE PACKAGE, AND LIGHTING SYSTEM

(75) Inventors: Jong Hak Won, Seoul (KR); Sun Kyung Kim, Seoul (KR); Kyoung Woo Jo, Seoul (KR); Joong Seo Park, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 116 days.

(21) Appl. No.: 13/112,022

(22) Filed: May 20, 2011

(65) Prior Publication Data

US 2011/0291070 A1    Dec. 1, 2011

(30) Foreign Application Priority Data

May 25, 2010   (KR) .................. 10-2010-0048596

(51) Int. Cl.
*H01L 33/00*   (2010.01)
(52) U.S. Cl.
USPC .............................................. 257/98; 257/13
(58) Field of Classification Search
USPC ....................................... 257/13, 98
See application file for complete search history.

(56) References Cited

U.S. PATENT DOCUMENTS

| 7,087,935 | B2 | 8/2006 | Nunoue et al. | |
|---|---|---|---|---|
| 7,906,785 | B2 | 3/2011 | Baik et al. | 257/79 |
| 8,164,107 | B2 * | 4/2012 | Cho et al. | 257/98 |
| 2004/0169188 | A1 * | 9/2004 | Nunoue et al. | 257/98 |
| 2008/0279242 | A1 | 11/2008 | Bour | |
| 2009/0057700 | A1 | 3/2009 | Jin et al. | 257/98 |
| 2009/0273003 | A1 | 11/2009 | Park | 257/99 |
| 2010/0219439 | A1 * | 9/2010 | Kim | 257/98 |
| 2011/0315996 | A1 | 12/2011 | Kim et al. | |

FOREIGN PATENT DOCUMENTS

| JP | 08-222761 A | 8/1996 |
|---|---|---|
| KR | 10-2006-0110521 A | 10/2006 |
| KR | 10-0723150 B1 | 5/2007 |
| KR | 10-0723249 B1 | 5/2007 |
| KR | 10-2008-0034581 A | 4/2008 |
| KR | 10-2009-0111856 A | 10/2009 |
| KR | 10-2009-0114826 A | 11/2009 |
| KR | 10-2010-0013802 A | 2/2010 |
| KR | 10-0956499 | 5/2010 |
| WO | WO 2008/089739 A1 | 7/2008 |
| WO | WO 2010-013936 A2 | 2/2010 |

OTHER PUBLICATIONS

Korean Office Action dated Apr. 22, 2011 issued in Application No. 10-2010-0048596.
Chinese Office Action issued in CN Appln. No. 201110135245.1 dated Mar. 13, 2013.

* cited by examiner

*Primary Examiner* — Douglas Menz
(74) *Attorney, Agent, or Firm* — Ked & Associates, LLP

(57) ABSTRACT

Provided are a light emitting device, a light emitting device package, and a lighting system. The light emitting device includes a substrate, a light emitting structure comprising a first conductive type semiconductor layer, an active layer, and a second conductive type semiconductor layer, the light emitting structure being disposed on the substrate, a nonmetal pattern disposed between the substrate and the active layer, the nonmetal pattern being spaced from the substrate, and an air gap disposed on a side surface of the nonmetal pattern.

20 Claims, 19 Drawing Sheets

LIGHT EMITTING DEVICE, LIGHT EMITTING DEVICE PACKAGE, AND LIGHTING SYSTEM

The present application claims priority under 35 U.S.C. 119 to Korean Patent Application No. 10-2010-0048596 filed May 25, 2010, which is hereby incorporated by reference in its entirety.

BACKGROUND

Embodiments relate to a light emitting device, a light emitting device package, and a lighting system.

Light emitting diodes (LEDs) are a kind of semiconductor device for converting electric energy into light. LEDs may realize various colors by adjusting a composition ratio and material of compound semiconductors.

In such an LED, when a forward voltage is applied, electrons of n-layer are combined with holes of a p-layer to generate light energy corresponding to an energy gap between a conduction band and a valance band.

Nitride semiconductors that are a kind of material constituting LEDs are attracting much attention for the fields of optical devices and high-power electronic devices because of their high thermal stability and wide band gap energy. Specifically, blue LEDs, red LEDs, green LEDs, and UV LEDs which use nitride semiconductors are being commercialized.

SUMMARY

Embodiments provide a light emitting device, a light emitting device package, and a lighting system.

Embodiments also provide a light emitting device having improved light emitting efficiency and a method of fabricating the same.

In one embodiment, a light emitting device comprises: a substrate; a light emitting structure comprising a first conductive type semiconductor layer, an active layer, and a second conductive type semiconductor layer, the light emitting structure being disposed on the substrate; a nonmetal pattern disposed between the substrate and the active layer, the nonmetal pattern being spaced from the substrate; and an air gap disposed on a side surface of the nonmetal pattern.

In another embodiment, a light emitting device package comprises: a body; at least one lead electrode disposed on the body; and a light emitting device electrically connected to the lead electrode, wherein the light emitting device comprises a substrate; a light emitting structure comprising a first conductive type semiconductor layer, an active layer, and a second conductive type semiconductor layer, the light emittting structure being disposed on the substrate; a nonmetal pattern disposed between the substrate and the active layer, the nonmetal pattern being spaced from the substrate; and an air gap disposed on a side surface of the nonmetal pattern.

In further another embodiment, a lighting system comprises: a board; and a light emitting module disposed on the board, the light emitting module comprising a light emitting device, wherein the light emitting device includes a substrate; a light emitting structure comprising a first conductive type semiconductor layer, an active layer, and a second conductive type semiconductor layer, the light emitting structure being disposed on the substrate; a nonmetal pattern disposed between the substrate and the active layer, the nonmetal pattern being spaced from the substrate; and an air gap disposed on a side surface of the nonmetal pattern.

The details of one or more embodiments are set forth in the accompanying drawings and the description below. Other features will be apparent from the description and drawings, and from the claims.

DETAILED DESCRIPTION OF THE EMBODIMENTS

Figure 1:
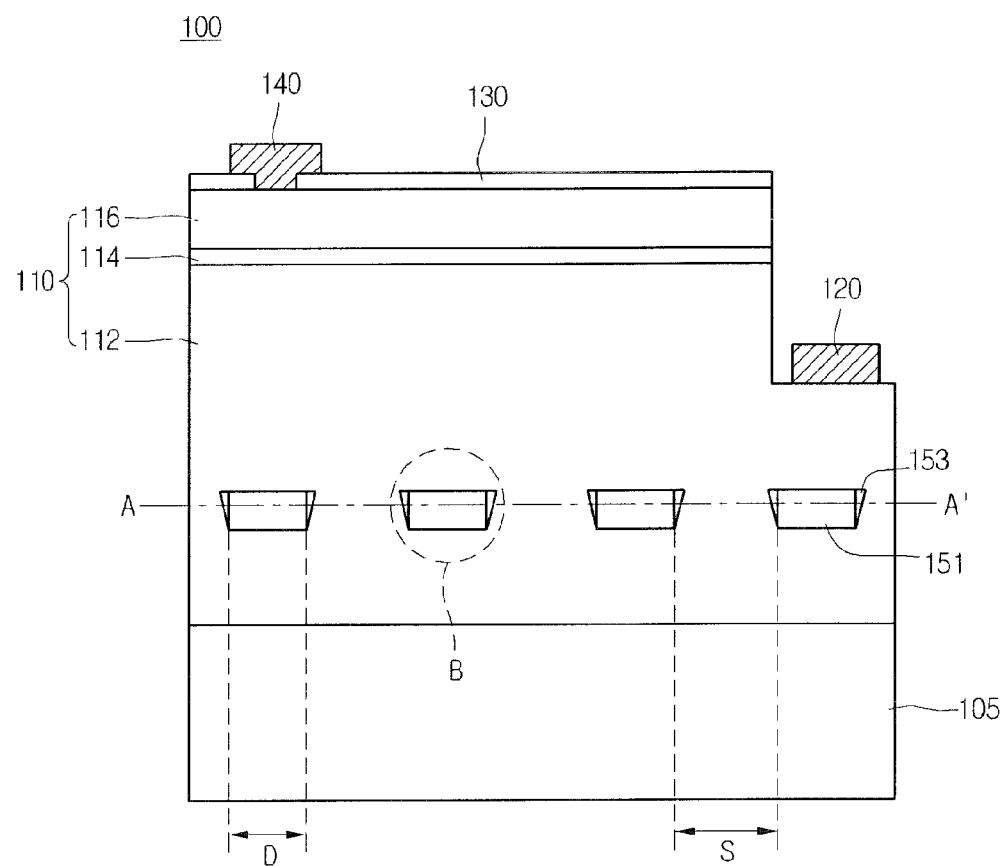
FIG. 1 is a side sectional view of a light emitting device according to an embodiment.

In the description of embodiments, it will be understood that when a layer (or film), region, pattern or structure is referred to as being 'on' another layer (or film), region, pad or pattern, the terminology of 'on' and 'under' includes both the meanings of 'directly' and 'indirectly'. Further, the reference about 'on' and 'under' each layer will be made on the basis of drawings.

In the drawings, the thickness or size of each layer is exaggerated, omitted, or schematically illustrated for convenience in description and clarity. Also, the size of each element does not entirely reflect an actual size.

Hereinafter, a light emitting device, a method of fabricating the light emitting device, and a light emitting device package according to an embodiment will be described with reference to accompanying drawings.

Figure 2:
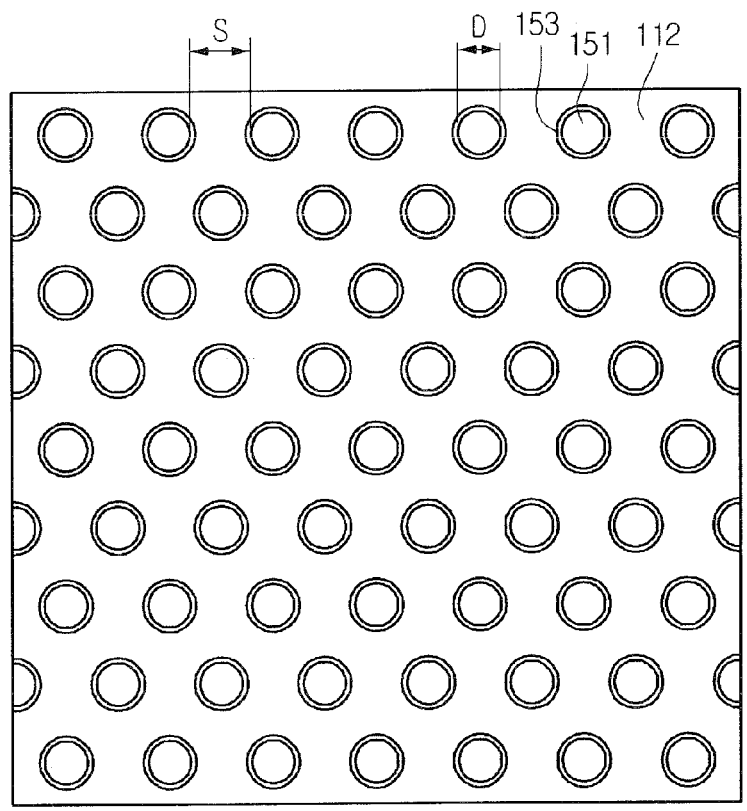
FIG. 2 is a sectional view taken along line A-A' of the light emitting device of FIG. 1.
Figure 3:
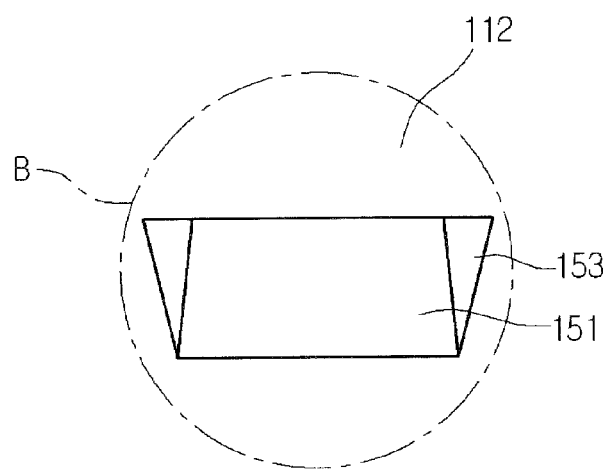
FIGS. 3 and 4 are views illustrating a region B of the light emitting device of FIG. 1.
Figure 4:
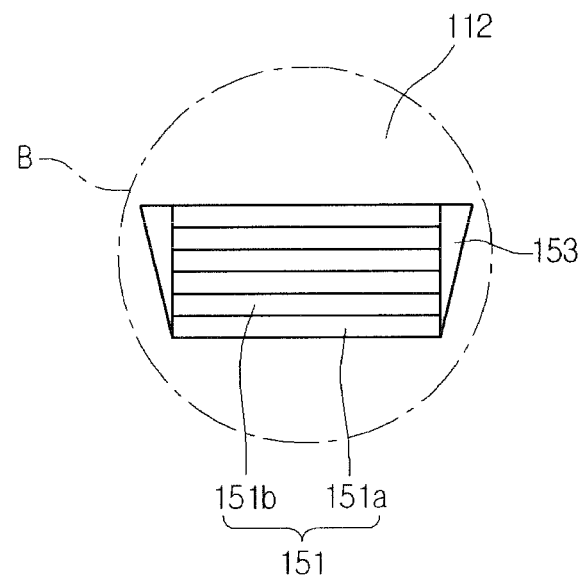

FIG. 1 is a side sectional view of a light emitting device 100 according to an embodiment. FIG. 2 is a sectional view taken along line A-A' of the light emitting device 100 of FIG. 1. FIGS. 3 and 4 are views illustrating a region B of the light emitting device 100 of FIG. 1.

Referring to FIGS. 1 to 4, the light emitting device 100 according to an embodiment may comprise a substrate 105, a light emitting structure 110 disposed on the substrate 105 and comprising a first conductive type semiconductor layer 112, an active layer 114, and a second conductive type semiconductor layer 116, a plurality of nonmetal patterns 151 disposed between the substrate 105 and the active layer 114, an air gap defined on side surfaces of the plurality of nonmetal patterns 151, a first electrode 120 disposed on the first conductive type semiconductor layer 112, a transparent electrode layer 130, and a second electrode 140. Here, the transparent electrode layer 130 and the second electrode 140 are disposed on the second conductive type semiconductor layer 116.

The substrate 105 may be formed of at least one of sapphire ($Al_2O_3$), SiC, GaN, Si, ZnO, AlN, GaAs, $\beta$-$Ga_2O_3$, GaP, InP, and Ge. The substrate 105 may be selected in consideration of differences in lattice constants and thermal expansion coefficients between the substrate 105 and the light emitting structure 110.

Also, a pattern and/or inclination may be disposed and/or defined on a top surface of the substrate 105. The pattern and/or inclination may facilitate growth of the light emitting structure 110 and improve light extraction efficiency of the light emitting device 100.

The light emitting structure 110 may be disposed on the substrate 105. The light emitting structure 110 may be formed of a group III-V compound semiconductor material, e.g., one of AlInGaN-based, GaAs-based, GaAsP-based, and GaP-based compound semiconductor materials. Electrons and holes supplied from the first and second conductive type semiconductor layers 112 and 116 may be recombined in the active layer 114 to generate light.

The first conductive type semiconductor layer 112 may be electrically connected to the first electrode 120, and the second conductive type semiconductor layer 116 may be electrically connected to the second electrode 140. Thus, the electrons and holes may be provided into the active layer 114.

The light emitting structure 110 may be grown on the substrate 105. For example, the light emitting structure 110 may be formed using at least one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

As described above, the light emitting structure 110 may comprise the first conductive type semiconductor layer 112, the active layer 114, and the second conductive type semiconductor layer 116.

The first conductive type semiconductor layer 112 may be formed of a group III-V compound semiconductor, which is doped with a first conductive type dopant, e.g., one of GaN, AlN, AlGaN, InGaN, InN, InAlGaN, AlInN, AlGaAs, GaP, GaAs, GaAsP, and AlGaInP. When the first conductive type semiconductor layer 112 is an n-type semiconductor layer, the first conductive type dopant may comprise an n-type dopant such as Si, Ge, Sn, Se, or Te. Also, the first conductive type semiconductor layer 112 may have a single or multi-layer structure, but is not limited thereto.

The active layer 114 may be disposed on the first conductive type semiconductor layer 112. The active layer 114 is a layer in which electrons (or holes) injected through the first conductive type semiconductor layer 112 and holes (or electrons) injected through the second conductive type semiconductor layer 116 are met with each other to emit light having energy determined by a proper energy band of the compound semiconductor material.

The active layer 114 may have one of a single quantum well structure, a multi quantum well (MQW) structure, a quantum dot structure, and a quantum wire structure. For example, when the active layer 114 has the MQW structure, the active layer 114 may be formed of a cycle of a well layer and a barrier layer, e.g., a cycle of an InGaN well layer/GaN barrier layer or a cycle of an InGaN well layer/AlGaN barrier layer using the group III-V compound semiconductor materials.

Also, a conductive type clad layer may be disposed on or/and under the active layer 114. The conductive type clad layer may be formed of an AlGaN-based semiconductor.

The second conductive type semiconductor layer 116 may be disposed on the active layer 114. The second conductive type semiconductor layer 116 may be formed of a group III-V compound semiconductor, which is doped with a second conductive type dopant, e.g., one of GaN, AlN, AlGaN, InGaN, InN, InAlGaN, AlInN, AlGaAs, GaP, GaAs, GaAsP, and AlGaInP. When the second conductive type semiconductor layer 116 is a p-type semiconductor layer, the second conductive type dopant may comprise a p-type dopant such as Mg or Zn. Also, the second conductive type semiconductor layer 116 may have a single or multi layer structure, but is not limited thereto.

The nonmetal patterns 151 may be disposed between the substrate 105 and the active layer 114. For example, the nonmetal patterns 151 may be disposed within the first conductive type semiconductor layer 112. The nonmetal patterns 151 may be spaced from the substrate 105 and disposed within the first conductive type semiconductor layer 112. That is, the nonmetal patterns 151 may be spaced from top and bottom surfaces of the first conductive type semiconductor layer 112 and disposed within the first conductive type semiconductor layer 112.

The nonmetal patterns 151 may scatter, refract, and reflect light emitted from the active layer 114 to improve light emitting efficiency of the light emitting device 100 according to an embodiment. That is, light extraction efficiency of the light emitting device 100 can be improved by the nonmetal patterns 151.

Also, the nonmetal patterns 151 may reduce a density of dislocation or defect, which occurs during the growth of the light emitting structure 110. That is, the dislocation or defect may occur in the light emitting structure 110 due to a difference between lattice constants of the light emitting structure 110 and the substrate 105. Here, the nonmetal patterns 151 may relieve the lattice constant difference. Therefore, the dislocation density in an upper region of the light emitting structure 110 with respect to the nonmetal patterns 151 may be less than that in a lower region of the light emitting structure 110.

Each of the nonmetal patterns 151 may be formed of a material having conductivity and insulation less than those of the light emitting structure 110. Also, the nonmetal pattern 151 may be formed of a material having a refractive index different from that of the light emitting structure 110. For example, the nonmetal pattern 151 may be formed of oxides. Alternatively, the nonmetal pattern 151 may be formed of nitrides.

For example, the nonmetal pattern 151 may be formed of at least one of $SiO_2$, $SiO_x$, $SiO_xN_y$, $Si_3N_4$, $Al_2O_3$, $MgF_2$, $TiO_2$, $ZrO_2$, $TaBO_3$, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), and gallium zinc oxide (GZO), but is not limited thereto.

As shown in FIG. 2, the nonmetal pattern 151 may have a circular shape, an oval shape, or a polygonal shape when viewed from an upper side, but is not limited thereto.

For specific example, a patterned mask may be formed and then a deposition process may be performed along the mask to form the nonmetal pattern 151. The configuration of the nonmetal pattern 151 may be determined by a configuration of the pattern formed on the mask. That is, the nonmetal pattern 151 may be variously deformed according to a design of the light emitting device 100 to realize an optimal configuration.

When the nonmetal pattern 151 has a pointed edge on a side surface thereof, the scattering effect of the nonmetal pattern 151 may be improved. Thus, to maximize the scattering effect of the nonmetal pattern 151, the nonmetal pattern 151 may have the polygonal shape such as a square shape or hexagonal shape when viewed from an upper side.

The air gap 153 may be disposed around the nonmetal pattern 151. Here, the air gap 153 may be disposed only around the nonmetal pattern 151 to prevent the air gaps 153 adjacent to each other from being coupled to each other.

Also, as shown in FIG. 3, the nonmetal pattern 151 may have an inclined side surface. This is done because it is difficult to form an accurately vertical side surface with respect to a bottom surface through a deposition process for forming the nonmetal pattern 151. However, the present disclosure is not limited thereto.

Also, as shown in FIG. 4, the nonmetal pattern 151 may have a multi-layer structure. The multi-layer structure of the nonmetal pattern 151 may be a structure in which at least two or more layers formed of materials different from each other are stacked with each other.

For example, the nonmetal pattern 151 may have a multi-layer structure in which a first layer 151a having a first refractive index and a second layer 151b having a second refractive index different from the first refractive index are alternately and repeatedly stacked with each other.

More particularly, the first layer 151a may be formed of a material having a low refractive index containing at least one of $SiO_2$ and $MgF_2$. Also, the second layer 151b may be formed of a material having a relatively high refractive index containing at least one of $TiO_2$, $Si_3N_4$, $ZrO_2$, and $TaBO_3$, but are not limited thereto.

Also, each of the first layer 151a and the second layer 151b may have a thickness of about $\lambda/(4 \text{ nm})$. Here, the reference symbol $\lambda$ denotes a wavelength of light emitted from the active layer 114, the reference symbol n denotes a refractive index of each of the first and second layers 151a and 151b, and the reference symbol m denotes a natural number. In this case, reflection characteristics of the first and second layers 151a and 151b can be improved to efficiently reflect light incident from the active layer 114.

The air gap 153 may be disposed on the side surface of the nonmetal pattern 151. For example, the air gap 153 may be a gap filled with air.

Since the air gap 153 has a significantly low refractive index than those of the light emitting structure 110 and the nonmetal pattern 151, light may be effectively dispersed. That is, light incident into the air gap 153 may be varied in incident direction, and thus is incident again into the light emitting structure 110. The amount of light extracted to the outside can be increased by the varied incident direction of the light.

A portion of the light emitting structure 110 may be primarily grown, the nonmetal pattern 151 may be formed, and the light emitting structure may be secondarily grown to naturally define the air gap 153.

That is, the air gap 153 may be defined by adjusting epitaxy lateral overgrowth (ELO) growth conditions for growing the light emitting structure 110.

Here, to efficiently define the air gap 153, the side surface of the nonmetal pattern 151 may be inclined or have other shapes adequate for defining the air gap 153, but is not limited thereto.

Figure 5:
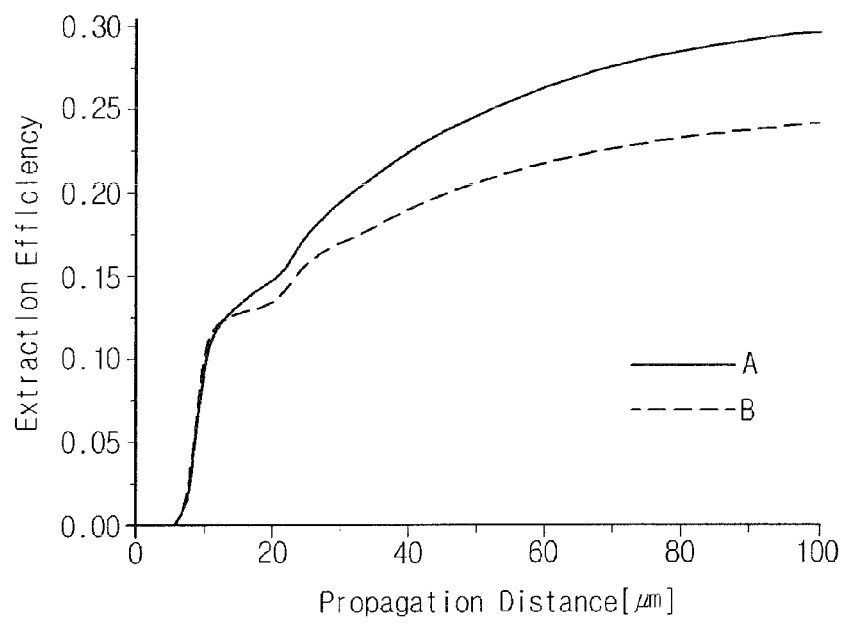
FIG. 5 is a graph of comparing light emitting efficiency of a light emitting device according to an embodiment to light emitting efficiency of a light emitting device on which a nonmetal pattern is not formed.

FIG. 5 is a graph of comparing light emitting efficiency of the light emitting device 100 according to an embodiment to light emitting efficiency of a light emitting device on which the nonmetal pattern 151 is not formed. An X-axis of FIG. 5 denotes a propagation distance (unit: μm) of light, a Y-axis denotes light extraction efficiency. A solid line A shows an experimental result obtained from the light emitting device 100 according to an embodiment, and a dot line B shows an experimental result obtained from the light emitting device on which the nonmetal pattern 151 is not formed.

Referring to FIG. 5, it is seen that the light extraction efficiency of the light emitting device 100 is improved by about 10% than that of the light emitting device on which the nonmetal pattern 151 is not formed. Also, it is seen that the improved degree is gradually increased as the propagation distance of light is increased.

Figure 6:
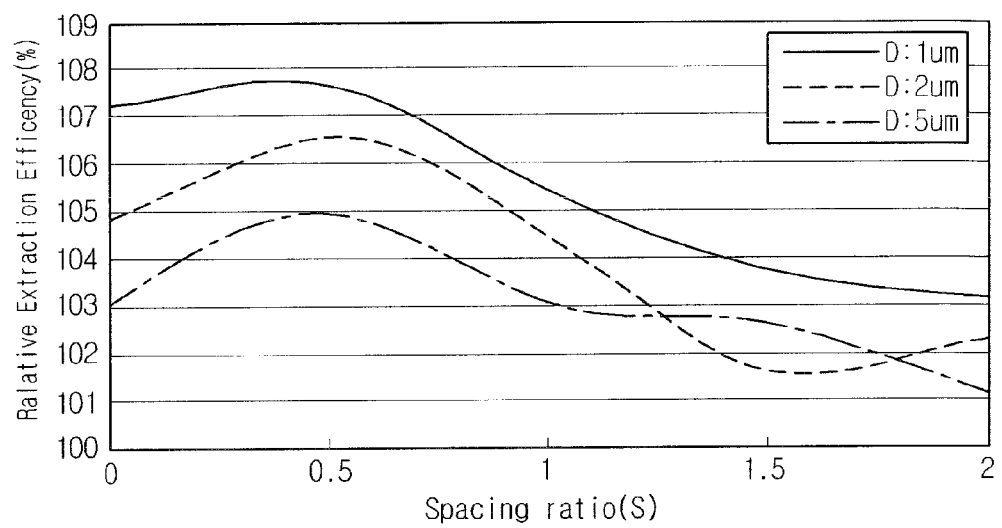
FIG. 6 is a graph illustrating experimental results obtained by measuring a relationship between the extraction efficiencies depending on variations of a width and distance of a nonmetal pattern of a light emitting device according to an embodiment.

FIG. 6 is a graph illustrating experimental results obtained by measuring a relationship between light extraction efficiencies depending on variations of a width and distance of the nonmetal pattern 150 of the light emitting device 100 according to an embodiment. Here, the current experimentation was performed under the condition in which the active layer 114 emits blue-based light having a wavelength of about 430 nm to about 470 nm.

Referring to FIGS. 1 and 6, in the experimental result obtained by adequately adjusting a width D and distance S of the nonmetal pattern 150, when the nonmetal pattern 150 has a width D of about 1 μm and a distance S between the plurality of nonmetal patterns 150 may be about 0.5 μm, the light extraction efficiency of the light emitting device 100 may be maximized.

That is, when the plurality of nonmetal patterns 150 has the width D and distance S, the light dispersion effect may be maximized. Also, the dislocation density of the light emitting structure 110 may be reduced to improve the light extraction efficiency of the light emitting device 100.

However, the present disclosure is not limited to the experimental results. For example, the width D and distance S of the nonmetal pattern 150 may be varied according to a design of the light emitting device 100.

Referring again FIG. 1, the first electrode 120 may be disposed on the first conductive type semiconductor layer 112, and the transparent electrode layer 130 and the second electrode 140 may be disposed on the second conductive type semiconductor layer 116.

The first and second electrodes 120 and 140 may be connected to an external power source to provide a lower to the light emitting structure 110.

For example, the first and second electrodes 120 and 140 may be formed of at least one of Cu, Au, Ag, Al, Ni, Mo, Pt, Pd, Ti, Sn, and Cr and have a single or multi-layer structure.

The transparent electrode layer 130 may spread a current to prevent a power transmitted from the second electrode 140 from concentrately flowing into the shortest distance between the first electrode 120 and the second electrode 140.

The transparent electrode layer 130 may be formed of a material having light transmittance and conductivity, for example, at least one of indium tin oxide (ITO), indium zinc oxide (IZO), indium zinc tin oxide (IZTO), indium aluminum zinc oxide (IAZO), indium gallium zinc oxide (IGZO), indium gallium tin (IGTO), aluminum zinc oxide (AZO), antimony tin oxide (ATO), gallium zinc oxide (GZO), IrOx, RuOx, Ni, Ag, and Au.

The transparent electrode layer 130 may be omitted, but is not limited thereto.

Hereinafter, a method of fabricating a light emitting device 100 according to an embodiment will be described in detail.

FIGS. 7 to 12 are views illustrating a method of fabricating the light emitting device 100 according to an embodiment.

Here, descriptions duplicated with those of the foregoing embodiment will be omitted or simply described.

Figure 7:
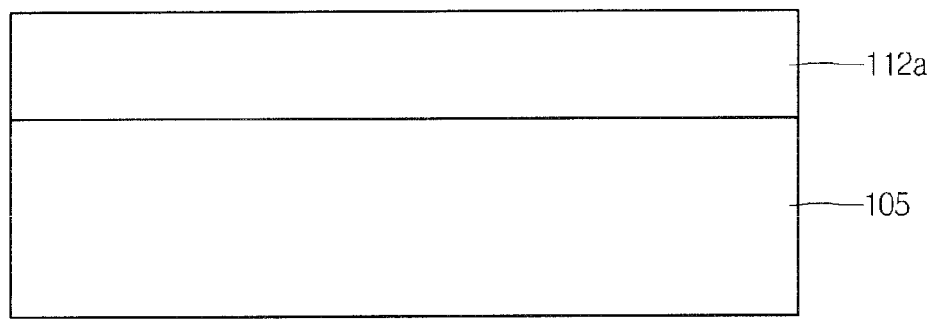
FIGS. 7 to 12 are views illustrating a method of fabricating a light emitting device according to an embodiment.

Referring to FIG. 7, a portion of the light emitting structure 110 may be formed on the substrate 105. That is, as shown in FIG. 7, a portion of a first conductive type semiconductor layer 112a may be primarily formed on the substrate 105.

Figure 8:
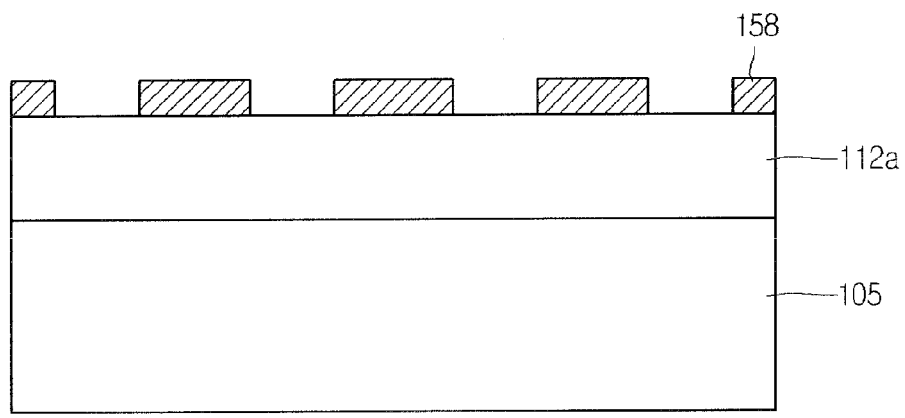

Referring to FIG. 8, a patterned mask layer 158 may be formed on the primarily formed first conductive type semiconductor layer 112a.

The mask layer 158 may be patterned corresponding to the nonmetal pattern 151. For example, the mask layer 152 may comprise photoresist, but it not limited thereto.

Figure 9:
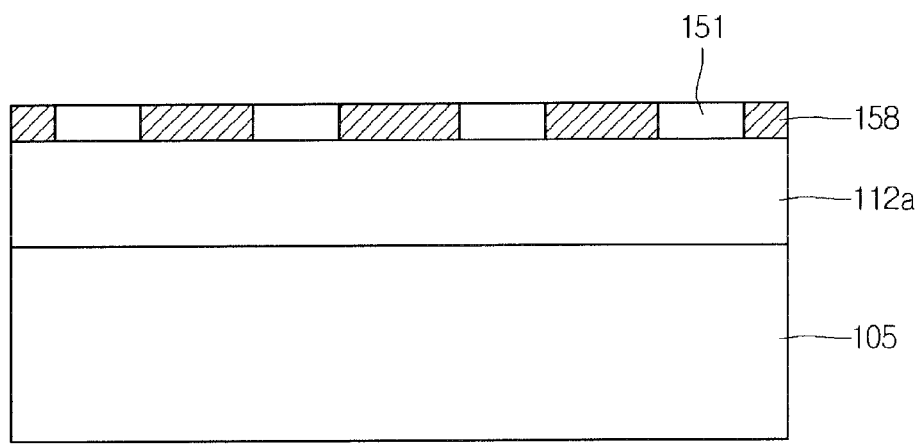

Referring to FIG. 9, the nonmetal pattern 151 may be formed along the mask layer 158.

For example, the nonmetal pattern 151 may be formed using at least one of a plasma enhanced chemical vapor deposition (PECVD) process, an E-beam deposition process, and a sputtering process, but is not limited thereto.

Figure 10:
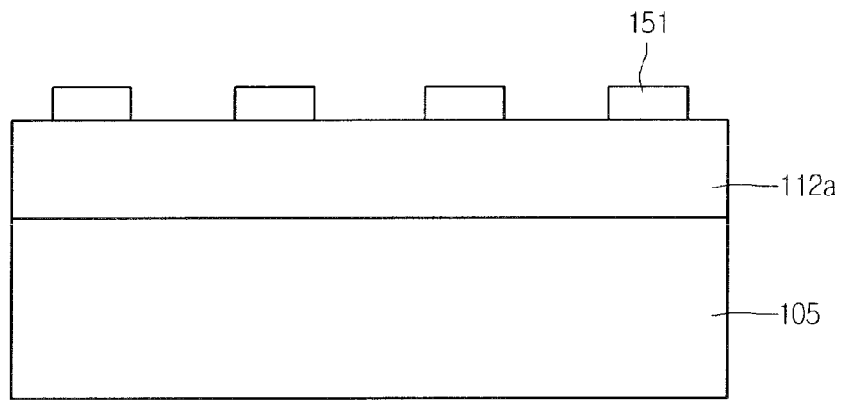

Referring to FIG. 10, the mask layer 158 may be removed after the nonmetal pattern 151 is formed.

The mask layer 158 may be removed using an etching process or an ashing process, but is not limited thereto.

Figure 11:
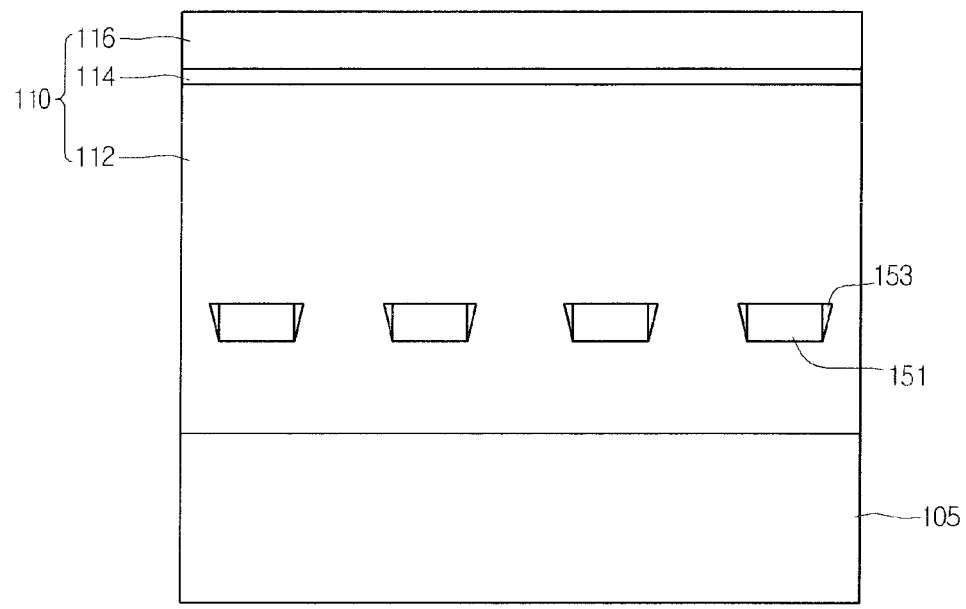

Referring to FIGS. 10 and 11, the remnant portion of the light emitting structure 110 may be formed on the first conductive type semiconductor layer 112a and the nonmetal pattern 151, which are primarily formed. That is, a first conductive type semiconductor layer 112, an active layer, a second conductive type semiconductor layer 116 may be formed.

For example, the light emitting structure 110 may be formed using at least one of a metal organic chemical vapor deposition (MOCVD) process, a chemical vapor deposition (CVD) process, a plasma-enhanced chemical vapor deposition (PECVD) process, a molecular beam epitaxy (MBE) process, and a hydride vapor phase epitaxy (HVPE) process, but is not limited thereto.

Here, when the light emitting structure 110 is grown, an air gap 153 may be formed on a side surface of the nonmetal pattern 151. As described above, the air gap 153 may be formed by adequately forming the side surface of the nonmetal pattern 151 or adjusting growth conditions of the light emitting structure 110, but is not limited thereto.

Figure 12:
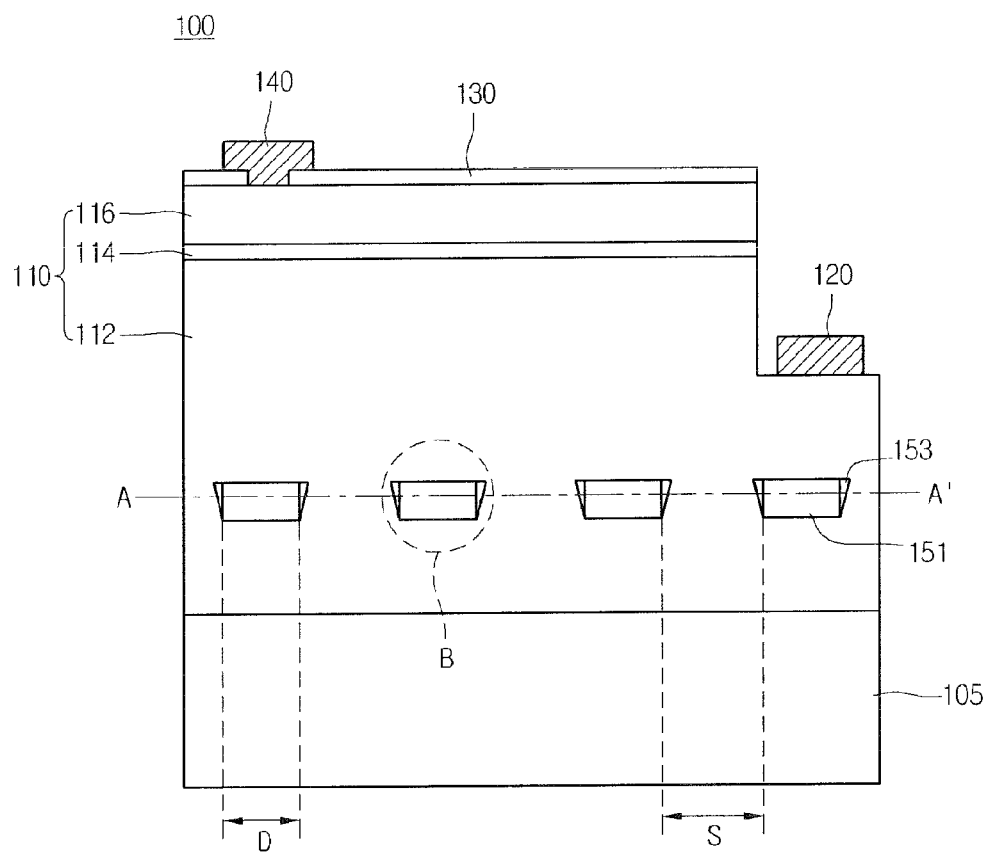

Referring to FIGS. 11 and 12, a first electrode 120 may be formed on the first conductive type semiconductor layer 112, and a transparent electrode layer 130 and a second electrode 140 may be formed on the second conductive type semiconductor layer 116 to provide the light emitting device 100 according to an embodiment.

To form the first electrode 120, a mesa etching process may be previously performed to expose a portion of a top surface of the first conductive type semiconductor layer 112.

The first and second electrodes 120 and 140 may be formed using a deposition or plating process. Also, transparent electrode layer 130, for example, may be formed using at least one of a plasma enhanced chemical vapor deposition (PECVD) process, an E-beam deposition process, and a sputtering process, but is not limited thereto.

Figure 13:
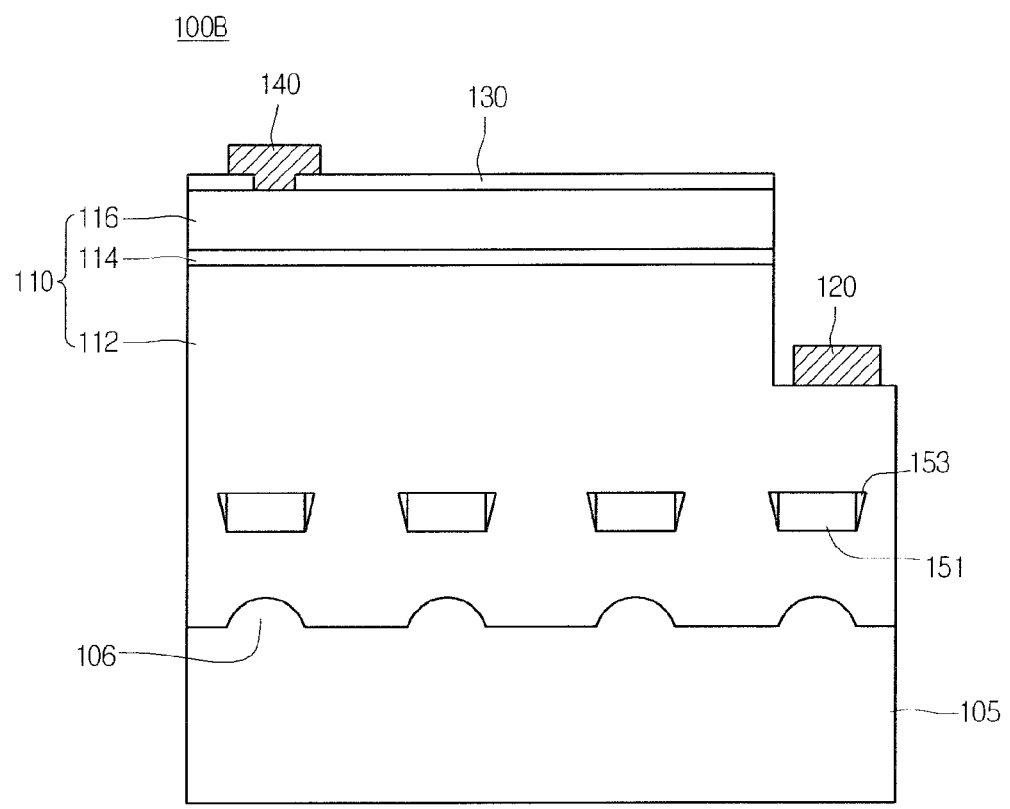
FIGS. 13 and 14 are side sectional view of a light emitting device according to another embodiment.
Figure 14:
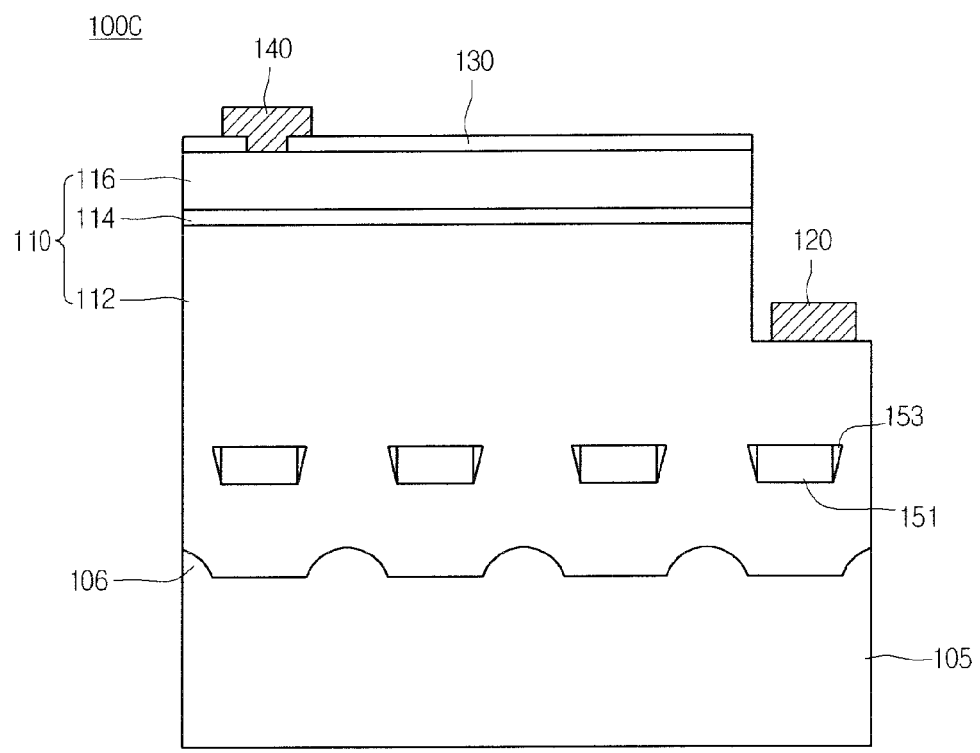

FIGS. 13 and 14 are side sectional views of light emitting devices 100B and 100C according to another embodiment.

Referring to FIGS. 13 and 14, each of the light emitting devices 100B and 100C may comprise a substrate 105 having patterns 106, a light emitting structure 110 disposed on the substrate 105 and comprising a first conductive type semiconductor layer 112, an active layer 114, and a second conductive type semiconductor layer 116, a plurality of nonmetal patterns 151 disposed between the substrate 105 and the active layer 114, an air gap defined on side surfaces of the plurality of nonmetal patterns 151, a first electrode 120 disposed on the first conductive type semiconductor layer 112, a transparent electrode layer 130 and a second electrode 140. Here, the transparent electrode layer 130 and the second electrode 140 are disposed on the second conductive type semiconductor layer 116.

In the light emitting device of FIG. 13, the patterns 106 disposed on the substrate 105 may vertically overlap the nonmetal patterns 151, respectively. In the light emitting device of FIG. 14, the patterns 106 disposed on the substrate 105 and the nonmetal pattern 151 may be misaligned each other.

Also, unlike the light emitting devices of FIGS. 13 and 14, the patterns 106 and the nonmetal patterns 151 may be randomly disposed with respect to each other.

The patterns 106 disposed on the substrate 105 may efficiently scatter, refract, and reflect light incident from light emitting structure 110. In addition, the patterns 106 may relieve a lattice constant difference between the substrate 105 and the light emitting structure 110 when the light emitting structure 110 is grown.

When the patterns 106 and the nonmetal patterns 151 are formed at the same time, light extraction efficiency of the light emitting devices 100B and 100C may be further improved.

Figure 15:
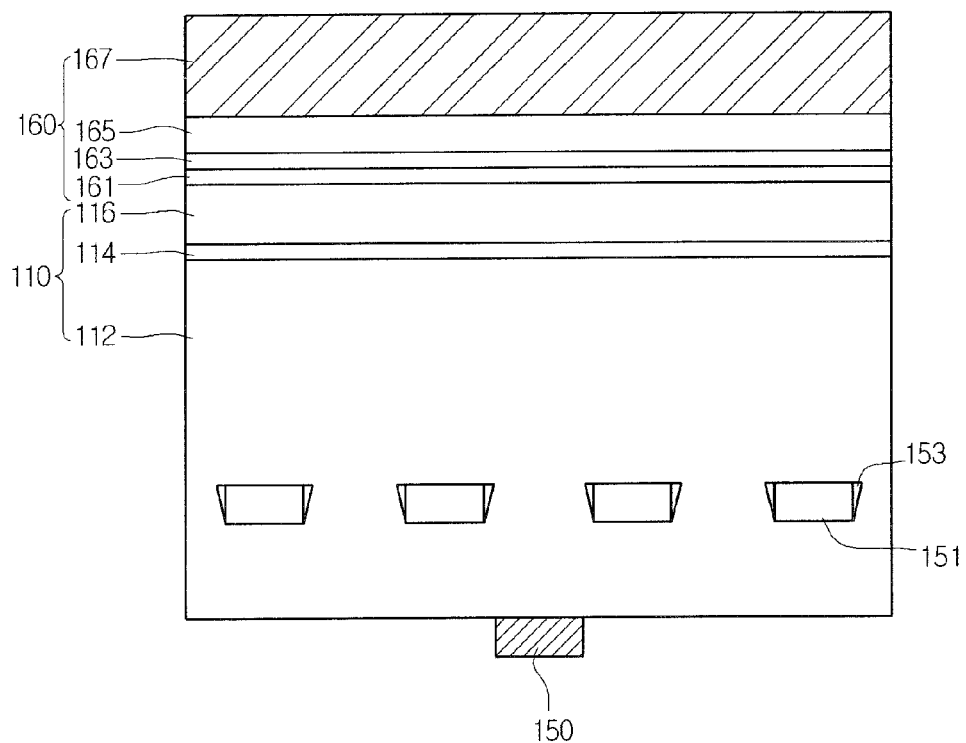
FIG. 15 is a side sectional view of a light emitting device according to another embodiment.

FIG. 15 is a side sectional view of a light emitting device 100D according to another embodiment.

Referring to FIG. 15, the light emitting device 100D may comprise an electrode layer 160, a light emitting structure 110 disposed under the electrode layer 160 and comprising a first conductive type semiconductor layer 112, an active layer 114, and a second conductive type semiconductor layer 116, a third electrode disposed under the light emitting structure 110, a nonmetal pattern 151 disposed within the light emitting structure 110, and an air gap disposed on a side surface of the nonmetal pattern 151. The nonmetal pattern 151 is spaced from top and bottom surfaces of the first conductive type semiconductor layer 112 and disposed within the first conductive type semiconductor layer 112.

At least portion of the electrode layer 160 may vertically overlap the third electrode 150 to realize a light emitting device having a vertical type electrode structure.

As shown in FIG. 15, the electrode layer 160 may comprise an ohmic layer 161, a reflective layer 163 disposed on the ohmic layer 161, an adhesion metal layer 165 disposed on the reflective layer 163, and a conductive support member 167 disposed on the adhesion metal layer 165.

The ohmic layer 161 may be formed of one of Indium Tin Oxide (ITO), Indium Zinc Oxide (IZO), Aluminum Zinc Oxide (AZO), Aluminum Gallium Zinc Oxide (AGZO), Indium Zinc Tin Oxide (IZTO), Indium Aluminum Zinc Oxide (IAZO), Indium Gallium Zinc Oxide (IGZO), Indium Gallium Tin Oxide (IGTO), Antimony Tin Oxide (ATO), Gallium Zinc Oxide (GZO), IZO Nitride (IZON), ZnO, IrOx, RuOx, and NiO. Also, the ohmic layer 161 may be formed of one of Ag, Ni, Al, Rh, Pd, Ir, Ru, Mg, Zn, Pt, Au, Hf, and combinations thereof. The ohmic layer 161 may have a single or multi-layer structure.

The reflective layer 163 may reflect light incident from the active layer 114 to improve light extraction efficiency of the light emitting device. The reflective layer 163 may be formed of a material having a high reflectance, for example, a metal or alloy containing at least one of Ag, Al, Pt, Pd, and Cu, but is not limited thereto.

The adhesion metal layer 165 may be disposed between the conductive support member 167 and the reflective layer 163 to improve an adhesion of an interface therebetween. The adhesion metal layer 165 may be formed of a metal material have a high adhesion force and conductivity, for example, a metal containing at least one of Ti, Au, Cu, and Ni, but is not limited thereto.

The conductive support member 167 may support the light emitting structure 110 and provide a power to the light emitting structure 110. For example, the conductive support member 167 may be formed of at least one of Ti, Cr, Ni, Al, Pt, Au, W, Cu, Mo, Cu—W, and a carrier wafer (e.g., Si, Ge, GaN, GaAs, ZnO, SiC, SiGe, or etc) in which impurities are injected.

Referring to FIGS. 11 and 15, the electrode layer 160 may be disposed on the light emitting device of FIG. 11, and then, the substrate 105 of FIG. 11 may be removed. Then, the third electrode 150 may be formed to provide the light emitting device 100D.

The substrate 105 may be removed using at least one of a laser lift off (LLO) method, a chemical lift off (CLO) method, and a physical polishing method, but is not limited thereof.

Figure 16:
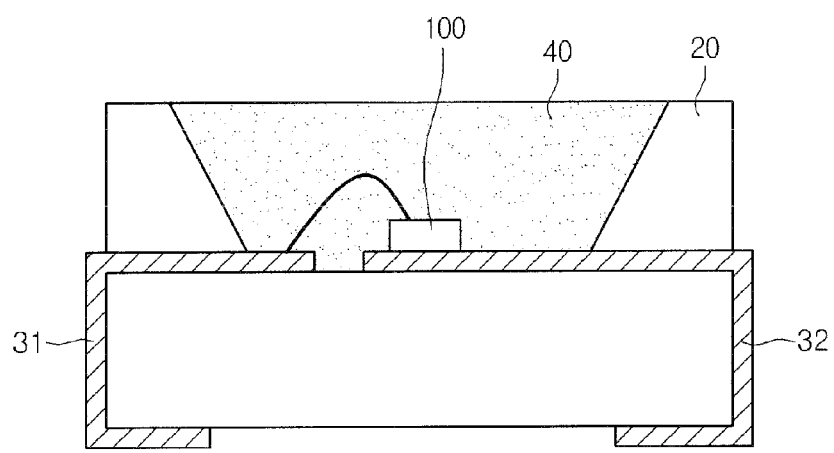
FIG. 16 is a sectional view of a light emitting device package comprising a light emitting device according to an embodiment.

FIG. 16 is a sectional view of a light emitting device package comprising a light emitting device 100 according to an embodiment.

Referring to FIG. 16, a light emitting device package according to an embodiment may comprise a body 20, first and second lead electrodes 31 and 32 disposed on the body 20, a light emitting device 100 disposed on the body 20 and electrically connected to the first and second lead electrodes 31 and 32, and a molding member 40 surrounding the light emitting device 100.

The body 20 may be formed of a silicon material, a synthetic resin material, or a metal material. An inclined surface may be disposed around the light emitting device 100.

The first and second lead electrodes 31 and 32 are electrically separated from each other and provide a power to the light emitting device 100. Also, the first and second lead electrodes 31 and 32 may reflect light generated in the light emitting device 100 to improve light efficiency. In addition, the first and second lead electrodes 31 and 32 may dissipate heat generated in the light emitting device 100 to the outside.

One of the first and second lead electrodes 31 and 32 may pass through the body 20. This structure may be varied according to an electrode structure of the light emitting device 100.

The light emitting device 100 may be disposed on the body 20 or disposed on the first lead electrode 31 or the second lead electrode 32.

The light emitting device 100 may be electrically connected to the first and second lead electrodes 31 and 32 through one of a wire method, a flip-chip method, and a die bonding method.

The molding member 40 may surround the light emitting device 100 to protect the light emitting device 100. Also, a phosphor may be contained in the molding member 40 to change a wavelength of light emitted from the light emitting device 100.

A lens may be disposed on the molding member 40. The lens may contact or may not contact a surface of the molding member 40, but is not limited thereto. The lens may have a convex lens shape, a concave lens shape, or a mixed shape of the convex lens shape and the concave lens shape.

The light emitting device according to the embodiment(s) may be packaged on a board or mounted on the board in a light emitting device package form, and thus, the light emitting device may be used as light sources for indicating devices, lighting device, and display devices. The light emitting device or the light emitting device package according to the embodiment may be applicable to a light unit as a light source. The light unit may have a structure in which a plurality of light emitting device packages is arrayed. Also, the light emitting device or the light emitting device package may be used as a side view type light source or a top view type light source. The light source may provide backlight light to a display panel. Also, the light emitting device or the light emitting device package may be applicable as a light source for the lighting device. The lighting device may comprise illumination lamps, traffic lights, vehicle headlights, and signs.

The semiconductor light emitting device according to the embodiment(s) may be packaged on resin material, a semiconductor substrate such as silicon, an insulation substrate, or a ceramic substrate and used as light sources for the indicating devices, the lighting devices, and the display devices. Also, the features of the embodiments may be selectively applied to another embodiment without being limited to each embodiment.

The light emitting device package according to the embodiment may be applicable to the light unit. The light unit may have a structure in which the plurality of light emitting device packages is arrayed.

Figure 17:
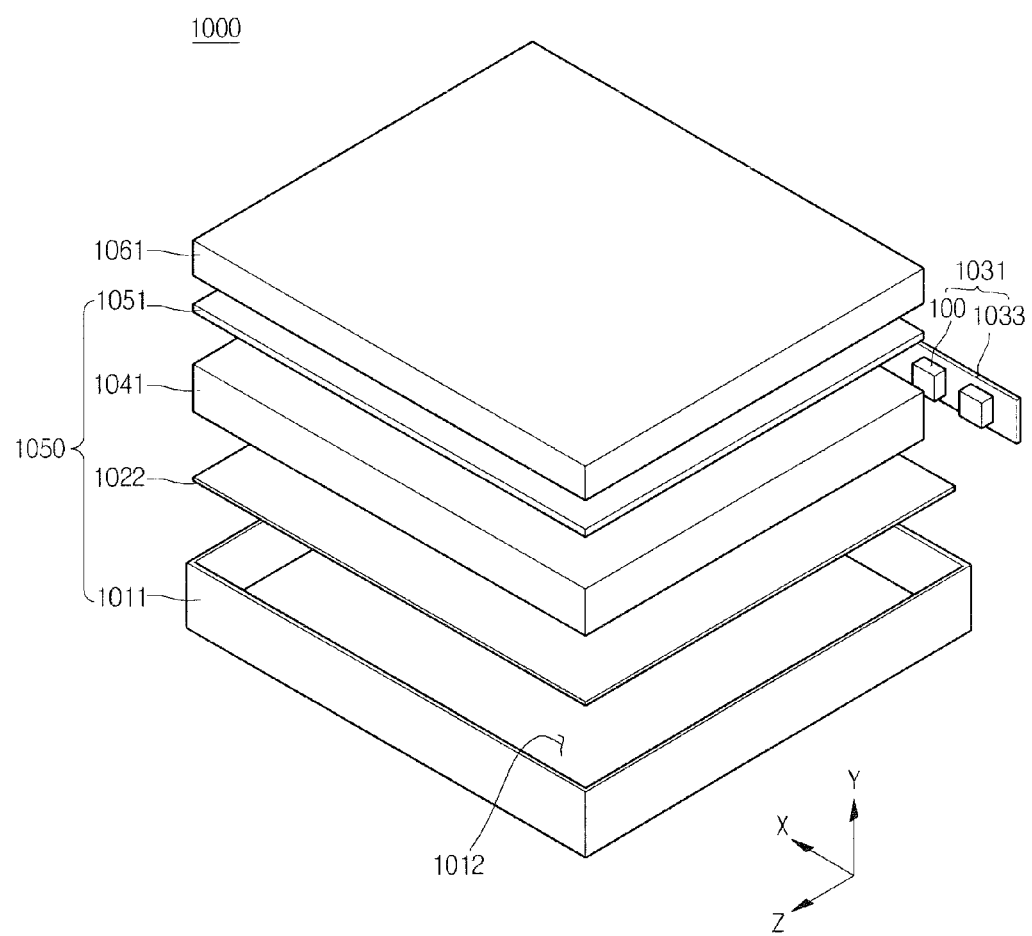
FIG. 17 is a view of a display device according to an embodiment.

FIG. 17 is an exploded perspective view of a display device according to an embodiment.

Referring to FIG. 17, a display device 1000 according to an embodiment may comprise a light guide plate 1041, a light emitting module 1031 for providing light to the light guide plate 1041, a reflective member 1022 disposed under the light guide plate 1041, an optical sheet 1051 disposed on the light guide plate 1041, a display panel 1061 disposed on the optical sheet 1051, and a bottom cover 1011 for receiving the light guide plate 1041, the light emitting module 1031, and the reflective member 1022, but is not limited thereto.

The bottom cover 1011, the reflective sheet 1022, the light emitting module 1031, the light guide plate 1041, and the optical sheet 1051 may be defined as a light unit 1050.

The light guide plate 1041 may diffuse light to produce planar light. The light guide plate 1041 may be formed of a transparent material, for example, one of an acryl-based material such as polymethylmethacrylate (PMMA), a polyethylene terephthalate (PET) resin, a poly carbonate (PC) resin, a cyclicolefin copolymer (COC) resin, and a polyethylene naphthalate (PEN) resin.

The light emitting module 1031 may provide light on at least one surface of the light guide plate 1041 and eventually serve as a light source of the display device.

At least one light emitting module 1031 may be disposed to directly or indirectly provide light on one side surface of the light guide plate 1041. The light emitting module 1031 may comprise a board 1033 and the light emitting device packages 200 according to the embodiment. The light emitting device or the light emitting device packages 200 may be arrayed with a predetermined distance on the board 1033. That is, the light emitting device may be arrayed on the board 1033 in a chip or package form.

The board 1033 may be a printed circuit board (PCB) having a circuit pattern. Also, the board 1033 may comprise a general PCB, a metal core PCB, or a flexible PCB, but is not limited thereto. When the light emitting device packages 200 are mounted on a side surface of the bottom cover 1011 or on a heatsink plate, the board 1033 may be removed. Here, a portion of the heatsink plate may contact a top surface of the bottom cover 1011.

The plurality of light emitting device packages 200 may be mounted on the board 1033 to allow a light emitting surface through which light is emitted to be spaced a predetermined distance from the light guide plate 1041, but is not limited thereto. The light emitting device packages 200 may directly or indirectly provide light to a light incident surface that is a side of the light guide plate 1041, but is not limited thereto.

The reflective member 1022 may be disposed under the light guide plate 1041. Since the reflective member 1022 reflects light incident into an under surface of the light guide plate 1041 upward, brightness of the light unit 1050 may be improved. For example, the reflective member 1022 may be formed of one of PET, PC, and PVC resins, but is not limited thereto. The reflective member 1022 may be the top surface of the bottom cover 1011, but is not limited thereto.

The bottom cover 1011 may receive the light guide plate 1041, the light emitting module 1031, and the reflective member 1022. For this, the bottom cover 1011 may include a receiving part 1012 having a box shape with an opened upper side, but is not limited thereto. The bottom cover 1011 may be coupled to a top cover, but is not limited thereto.

The bottom cover 1011 may be formed of a metal material or a resin material. Also, the bottom cover 1011 may be manufactured using a press molding process or an extrusion molding process. The bottom cover 1011 may be formed of a metal or nonmetal material having superior heat conductivity, but is not limited thereto.

For example, the display panel 1061 may be a liquid crystal display (LCD) panel and comprise first and second boards formed of a transparent material and a liquid crystal layer between the first and second boards. A polarizing plate may be attached to at least one surface of the display panel 1061. The present disclosure is not limited to the attached structure of the polarizing plate. The display panel 1061 displays information using light passing through the optical sheet 1051. The display device 1000 may be applied to various portable terminals, monitors for notebook computers, monitors for laptop computers, televisions, etc.

The optical sheet 1051 may be disposed between the display panel 1061 and the light guide plate 1041 and comprise at least one light-transmittance sheet. For example, the optical sheet 1051 may comprise at least one of a diffusion sheet, a horizontal or/and vertical prism sheet, a brightness enhanced sheet, etc. The diffusion sheet diffuses incident light, and the horizontal or/and vertical prism sheet concentrates the incident light into a display region. In addition, the brightness enhanced sheet reuses lost light to improve the brightness. Also, a protection sheet may be disposed on the display panel 1061, but is not limited thereto.

Here, optical members such as the light guide plate 1041 and the optical sheet 1051 may be disposed on an optical path of the light emitting module 1031, but is not limited thereto.

Figure 18:
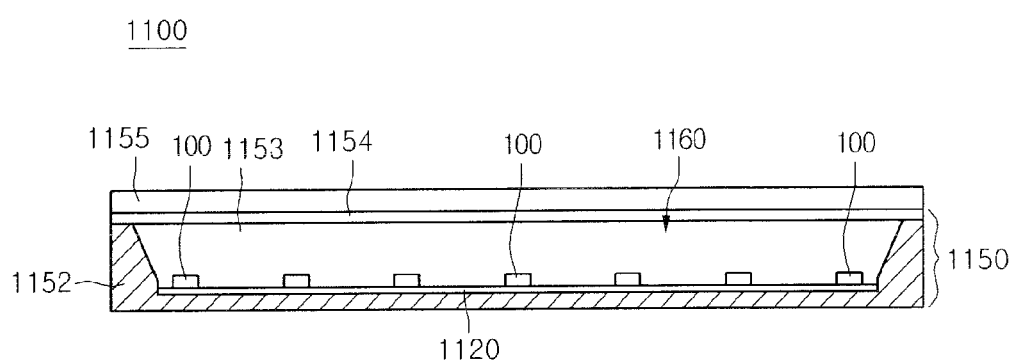
FIG. 18 is a view illustrating a modified example of a display device according to an embodiment.

FIG. 18 is a view illustrating a modified example of a display device according to an embodiment. The package of FIG. 18 may have a structure in which light emitting devices are arrayed in a chip or package form.

Referring to FIG. 18, a display device 1100 may comprise a bottom cover 1152, a board 1120 on which the above-described light emitting device packages 200 are arrayed, an optical member 1154, and a display panel 1155.

The board 1120 and the light emitting device package 200 may be defined as a light emitting module 1060. The bottom cover 1152, at least one light emitting module 1060, and the optical member 1154 may be defined as a light unit. The light emitting device may be arrayed on the board 1129 in the chip or package form.

The bottom cover 1152 may comprise a receiving part 1153, but is not limited thereto.

Here, the optical member 1154 may comprise at least one of a lens, a light guide plate, a diffusion sheet, horizontal and vertical prism sheets, and a bright enhanced sheet. The light guide plate may be formed of a PC material or PMMA material. In this case, the light guide plate may be removed. The diffusion sheet diffuses incident light, and the horizontal and vertical prism sheets concentrate the incident light into a display region. The brightness enhanced sheet reuses lost light to improve brightness.

Figure 19:
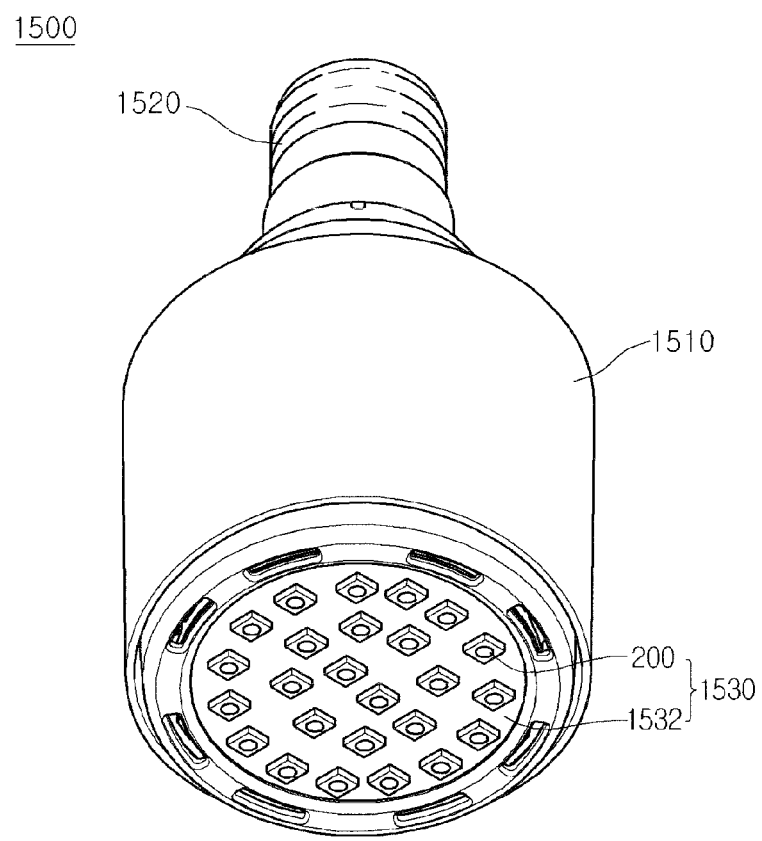
FIG. 19 is a view of a light unit according to an embodiment.

FIG. 19 is a view of a lighting unit according to an embodiment.

Referring to FIG. 19, the lighting system 1500 may comprise a case 1510, a light emitting module 1530 disposed in the case 1510, and a connection terminal 1520 disposed in the case 1510 to receive an electric power from an external power source.

The case 1510 may be formed of a material having good heat dissipation characteristics, for example, a metal material or a resin material.

The light emitting module 1530 may comprise a board 1532 and a light emitting device package 200 provided on the board 1532. The light emitting device package 200 may be provided in plurality, and the plurality of light emitting device packages 200 may be arrayed in a matrix shape or Spaced a predetermined distance from each other. The light emitting devices may be arrayed on the board 1532 in a chip or package form.

The board 1532 may be an insulator on which a circuit pattern is printed. For example, the board may comprise at least one of a general printed circuit board (PCB), a metal core PCB, a flexible PCB, a ceramic PCB, etc.

Also, the board 1532 may be formed of a material that efficiently reflects light, and a surface thereof may be formed in a color capable of efficiently reflecting light. For example, the board 1532 may be a coated layer having a white color or a silver color.

The at least one light emitting device packages 200 may be mounted on the board 1532. Each of the light emitting device packages 200 may comprise at least one light emitting diode (LED) chip. The LED chip may comprise a color LED emitting red, green, blue or white light, and a UV LED emitting ultraviolet (UV) rays.

The light emitting module 1530 may have a combination of several light emitting device packages 200 to obtain desired color and luminance. For example, the light emitting module 1530 may have a combination of a white LED, a red LED, and a green LED to obtain a high color rendering index (CRI).

The connection terminal 1520 may be electrically connected to the light emitting module 1530 to supply a power. The connection terminal 1520 may be screw-coupled to an external power source in a socket type, but is not limited thereto. For example, the connection terminal 1520 may be made in a pin type and inserted into an external power source, or may be connected to the external power source through a wire.

The embodiments may provide a light emitting device, a light emitting device package, and a lighting system.

The embodiments may also provide a light emitting device having improved light emitting efficiency and a method of fabricating the same.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device, comprising:
   a substrate;
   a light emitting structure comprising a first conductive type semiconductor layer, an active layer, and a second conductive type semiconductor layer, the light emitting structure being disposed on the substrate;
   a nonmetal pattern disposed between the substrate and the active layer, the nonmetal pattern being spaced from the substrate; and
   an air gap disposed along a peripheral side edge portion of the nonmetal pattern extending between top and bottom surfaces thereof, wherein the nonmetal pattern and the air gap are arranged substantially parallel to a top surface of the substrate.

2. The light emitting device according to claim 1, wherein the light emitting structure has a dislocation density of an upper region less than a dislocation density of a lower region with respect to the nonmetal pattern.

3. The light emitting device according to claim 1, wherein the nonmetal pattern has conductivity less than conductivity of the light emitting structure.

4. The light emitting device according to claim 1, wherein the nonmetal pattern is formed of at least one of $SiO_2$, $SiO_x$, $SiO_xN_y$, $Si_3N_4$, $Al_2O_3$, $MgF_2$, $TiO_2$, $ZrO_2$, $TaBO_3$, indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), or gallium zinc oxide (GZO).

5. The light emitting device according to claim 1, wherein the nonmetal pattern has a circular shape, an oval shape, or a polygonal shape when viewed from an upper side.

6. The light emitting device according to claim 1, wherein the nonmetal pattern has an inclined side surface.

7. The light emitting device according to claim 1, wherein the nonmetal pattern has a multi-layer structure in which at least two or more layers formed of materials different from each other are stacked with each other.

8. The light emitting device according to claim 7, wherein the nonmetal pattern has a multi-layer structure in which a first layer having a first refractive index and a second layer having a second refractive index different from the first refractive index are alternately and repeatedly stacked with each other.

9. The light emitting device according to claim 8, wherein the first layer is fanned of a material having a low refractive index containing at least one of $SiO_2$ or $MgF_2$, and the second layer is formed of a material having a relatively high refractive index containing at least one of $TiO_2$, $Si_3N_4$, $ZrO_2$ or $TaBO_3$.

10. The light emitting device according to claim 8, wherein each of the first layer and the second layer has a thickness of about $\lambda/(4 \text{ nm})$, where the reference symbol $\lambda$ denotes a wavelength of light emitted from the active layer, the reference symbol n denotes a refractive index of each of the first and second layers, and the reference symbol m denotes a natural number.

11. The light emitting device according to claim 1, wherein the nonmetal pattern has a width of about 1 μm and a distance between the nonmetal pattern and an adjacent nonmetal pattern is about 0.5 μm.

12. The light emitting device according to claim 1, wherein the substrate comprises a pattern disposed on a top surface thereof.

13. The light emitting device according to claim 1, further comprising a transparent electrode layer on the second conductive type semiconductor layer.

14. The light emitting device according to claim 1, further comprising a first electrode on the first conductive type semiconductor layer and a second electrode on the second conductive type semiconductor layer.

15. The light emitting device according to claim 1, wherein the nonmetal pattern is disposed within the first conductive type semiconductor layer.

16. A light emitting device, comprising:
    a light emitting structure comprising a first conductive type semiconductor layer, an active layer, and a second conductive type semiconductor layer;
    a nonmetal pattern having a top surface, a bottom surface, and a side surface, and disposed in the light emitting structure; and
    an air gap disposed near the nonmetal pattern,
    wherein the air gap surrounds a side peripheral surface of the nonmetal pattern extending between top and bottom surfaces thereof, and
    wherein a refractive index of the nonmetal pattern is different from a refractive index of the first conductive type semiconductor layer.

17. The light emitting device according to claim 16, wherein the nonmetal pattern has a multi-layer structure including at least one first layer having a first refractive index and at least one second layer having a second refractive index that is different from the first refractive index.

18. The light emitting device according to claim 17, wherein the first layer is formed of a material having a low refractive index containing at least one of $SiO_2$ or $MgF_2$, and the second layer is fokined of a material having a relatively high refractive index containing at least one of $TiO_2$, $Si_3N_4$, $ZrO_2$, or $TaBO_3$.

19. A light emitting device, comprising:
    a substrate;
    a light emitting structure comprising an n type conductive type semiconductor layer, an active layer, and a p-type conductive type semiconductor layer, the light emitting structure being disposed on the substrate;
    a plurality of nonmetal patterns disposed between the substrate and the active layer, the plurality of nonmetal patterns being spaced from the substrate; and
    an air gap disposed between the plurality of nonmetal patterns,
    wherein the air gap is disposed on two opposite side surfaces of at least one of the plurality of nonmetal patterns, and
    wherein a refractive index of the plurality of nonmetal patterns is different from a refractive index of the n-type conductive type semiconductor layer.

20. The light emitting device according to claim 19, wherein the plurality of the nonmetal patterns includes a first nonmetal pattern and a second nonmetal pattern, and wherein a distance between the first nonmetal pattern and the second nonmetal pattern is about 0.5 μm.

* * * * *